(12) United States Patent
Still

(10) Patent No.: US 7,760,540 B2
(45) Date of Patent: Jul. 20, 2010

(54) COMBINATION SRAM AND NVSRAM SEMICONDUCTOR MEMORY ARRAY

(75) Inventor: David W. Still, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 282 days.

(21) Appl. No.: 11/644,789

(22) Filed: Dec. 22, 2006

(65) Prior Publication Data

US 2008/0151624 A1  Jun. 26, 2008

(51) Int. Cl.
*G11C 11/00* (2006.01)
(52) U.S. Cl. .................. 365/154; 365/185.07
(58) Field of Classification Search ................ 365/154, 365/185.07, 230.03
See application file for complete search history.

(56) References Cited

U.S. PATENT DOCUMENTS

| | | |
|---|---|---|
| 4,095,281 A | 6/1978 | Denes |
| 4,342,101 A | 7/1982 | Edwards |
| 4,435,786 A | 3/1984 | Tickle |
| 4,510,584 A | 4/1985 | Dias et al. |
| 4,538,246 A | 8/1985 | Wang et al. |
| 4,638,465 A | 1/1987 | Rosini et al. |
| 5,353,248 A | 10/1994 | Gupta |
| 5,523,971 A | 6/1996 | Rao |
| 5,648,930 A | 7/1997 | Randazzo |
| 5,663,905 A * | 9/1997 | Matsuo et al. ............... 365/149 |
| 5,677,866 A | 10/1997 | Kinoshita |
| 5,680,363 A | 10/1997 | Dosaka et al. |
| 5,774,397 A | 6/1998 | Endoh et al. |
| 5,914,895 A * | 6/1999 | Jenne ..................... 365/185.08 |
| 6,785,167 B2 * | 8/2004 | Kurth et al. ............. 365/189.15 |
| 2006/0193174 A1 * | 8/2006 | Choi et al. ............. 365/185.08 |

OTHER PUBLICATIONS

"nvSRAM Basics," Simtek 1999 Data Book, Chapter 8; 8-1 through 8-5, 5 pages.
USPTO Notice of Allowance for U.S. Appl. No. 08/926,611 dated Dec. 14, 1998; 3 pages.
USPTO Non-Final Rejection for U.S. Appl. No. 08/926,611 dated Jul. 7, 1998; 5 pages.
Betty Price, "Semiconductor Memories: A Handbook of Design, Manufacture and Application," Second Edition, Texas Instruments, John Wiley & Sons, 1983, pp. 611-620; 11 pages.
Herdt et al., "A 256K Nonvolatile Static RAM," Simtek Corporation, No. 5.3, 1995, pp. 1-4; 4 pages.
Ohnakado et al., "Novel Electron Injection Method Using Band-to-Band Tunneling Induced Hot Electron (BBHE) for Flash Memory with a P-Channel Cell," IEDM 95-279, 1995, pp. 11.5.1-11.5.4; 4 pages.

* cited by examiner

*Primary Examiner*—Vu A Le

(57) ABSTRACT

A semiconductor memory array having a first memory cell array with a number of first memory cells and a second cell array with a number of second memory cells. The memory cells in the first and second memory cell arrays are arranged in rows and columns. Each column of second memory cells in the second memory array is coupled to a column of first memory cells in the first memory array.

23 Claims, 6 Drawing Sheets

COMBINATION SRAM AND NVSRAM SEMICONDUCTOR MEMORY ARRAY

BACKGROUND OF THE INVENTION

1. Field of the Invention

The present invention is generally directed to memory, and more particularly to providing a semiconductor memory array having a number of non-volatile Static Random Access Memory (nvSRAM) cells as well as a number of Static Random Access Memory (SRAM) cells coupled together in a single array.

2. The Relevant Technology

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

There are several types of semiconductor memory devices, typically arranged in a number of rows and columns in an array. There are no known semiconductor arrays having a combination of non-volatile memory cells and volatile memory cells in a single array. More specifically, SRAM cell arrays are well known in the art, as are arrays of non-volatile SRAM cells. However, SRAM cells and non-volatile SRAM cells have not been combined together to form a single array of SRAM cells and non-volatile SRAM cells. Moreover, there is nothing to motivate one skilled in the art to combine the two types into a single array, since the use and operation of the two is significantly different. It would therefore be advantageous to provide a semiconductor array having a combination of non-volatile SRAM cells and SRAM cells in a single device array.

BRIEF SUMMARY OF THE INVENTION

In one embodiment, a semiconductor memory array having a first memory cell array with a number of first memory cells and a second cell array with a number of second memory cells is disclosed. The memory cells in the first and second memory cell arrays are arranged in a matrix of rows and columns. Each column of second memory cells in the second memory array is coupled to a column of first memory cells in the first memory array.

In another embodiment, semiconductor memory array is disclosed having a first plurality of non-volatile SRAM cells arranged in a first plurality of rows and columns in the array and a second plurality of SRAM cells arranged in a second plurality of rows and columns in the array. Each column of non-volatile SRAM cells is coupled to a column of SRAM cells.

In still another embodiment, a semiconductor device array has a first memory cell array with a plurality of first memory cells arranged in a matrix of rows and columns and a second memory cell array including a plurality of second memory cells arranged in a matrix of rows and columns. The second memory cells are a different type of memory cell than the first memory cells. A column selecting means is coupled to the first memory array and the second memory array. The column selecting means is configured for selecting a combined column of memory cells. The combined column of memory cells has both a number of first memory cells from the plurality of first memory cells and a number of second memory cells from the plurality of second memory cells. A row selecting means is coupled to said first memory array and the second memory array.

The row selecting means is configured for selecting a row of memory cells from the first memory array and the second memory array. The column selecting means and the row selecting means are configured for selecting a single memory cell within either the first memory array or the second memory array.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

A semiconductor device array having a first array of a plurality of first memory cells arranged in a matrix of rows and columns and a second array of a plurality of second memory cells arranged in a matrix of rows and columns is disclosed. In one embodiment, the first plurality of memory cells are a number of SRAM memory cells and the second plurality of memory cells are a number of nvSRAM cells. Each column of first memory cells are coupled to a column of second memory cells.

Typically, the columns of SRAM cells and nvSRAM cells that are aligned are coupled to a common bit line pair that runs parallel to the combined column and the SRAM cells and the nvSRAM cells are positioned at a location between the first and second bit lines of the bit line pair. A transistor coupled to a first internal data node of either the SRAM cell or nvSRAM cell is typically coupled to the first bit line and a transistor coupled to a second internal data node of either the SRAM cell or nvSRAM cell is typically coupled to the second bit line forming the connection between the SRAM cell or nvSRAM cell and the bit line pair.

Figure 1:
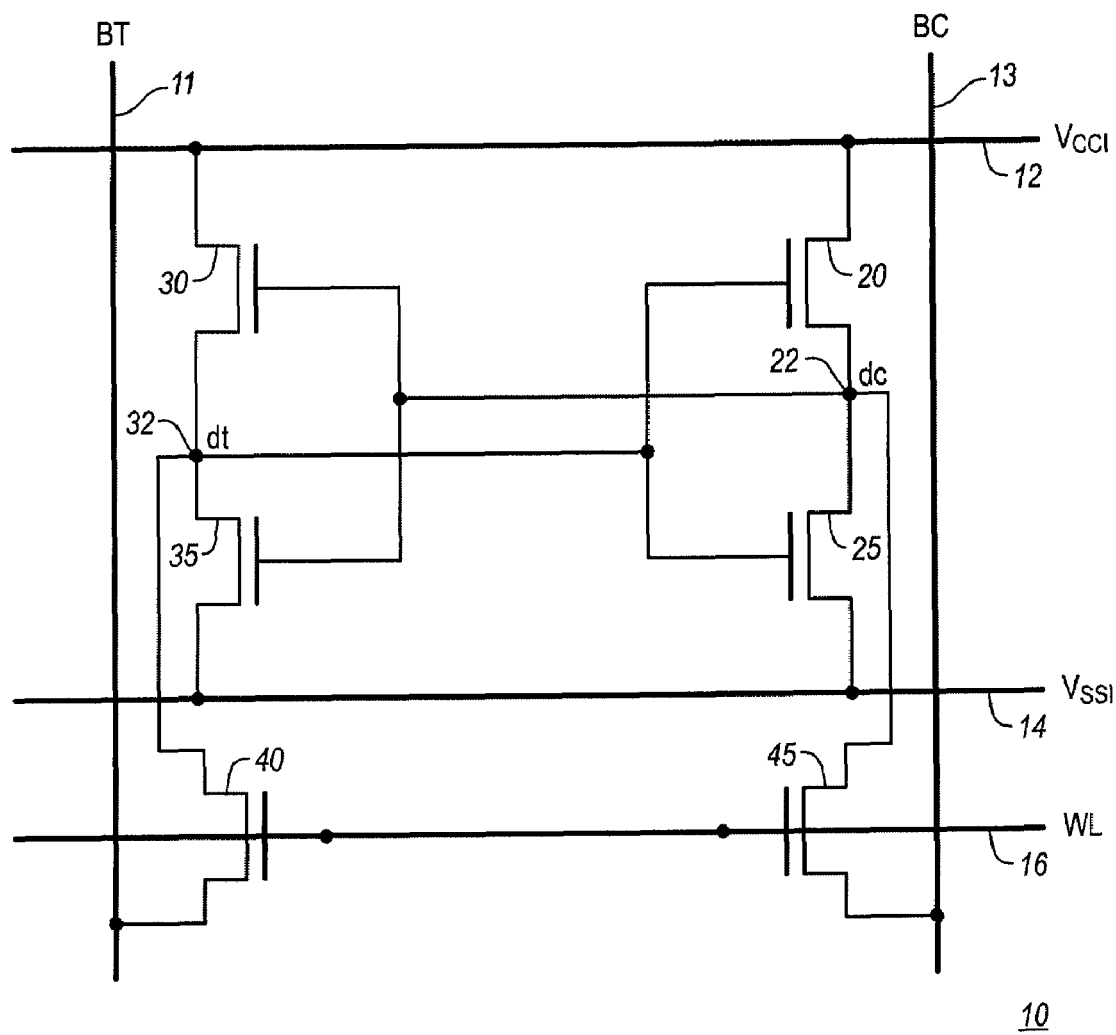
FIG. 1 is a schematic diagram illustrating a SRAM memory cell in accordance with one embodiment of the present invention.

FIG. 1 illustrates a typical SRAM cell 10 that is well known in the art. While the SRAM device 10 is illustrated as a single SRAM memory cell, it should be appreciated that an SRAM device typically includes a plurality of SRAM cells that are integrated with the read and write control onto a single semiconductor chip to form an array. One such example of an SRAM array 50 is illustrated in FIG. 3.

A basic SRAM cell 10 is comprised of a static random access memory (SRAM) cell that is capable of communicating a bit of data to and from an exterior environment. More particularly, the SRAM cell 10 is capable, as long as power is being provided, of receiving a bit of data from an exterior environment, retaining the bit of data and transmitting the bit of data back to the exterior environment. If, however, power is removed from the SRAM cell 10, the SRAM cell will lose the bit of data.

Figure 3:
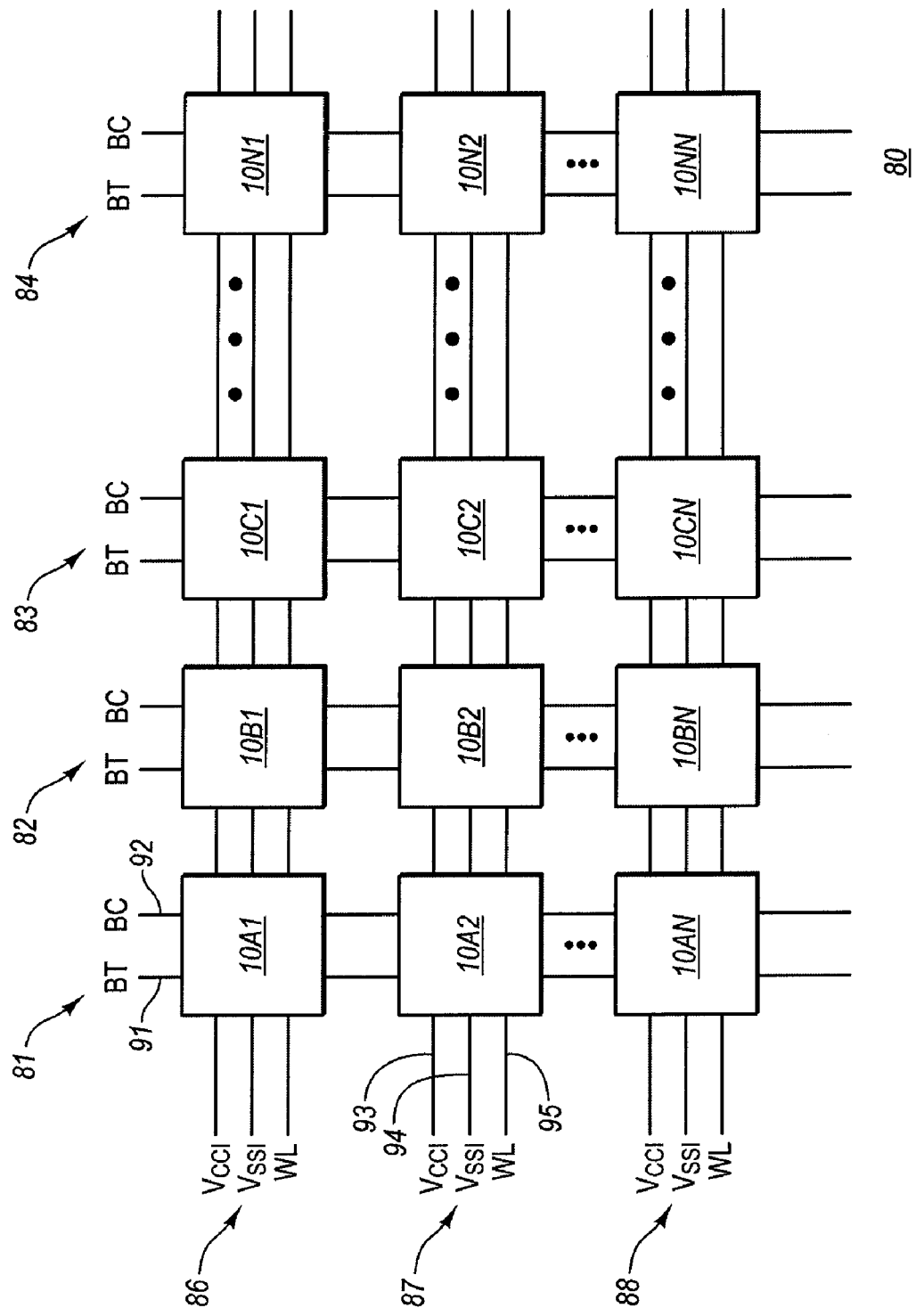
FIG. 3 is a block diagram illustrating a portion of an array of SRAM memory cells shown in FIG. 2.

Typically, as illustrated in FIG. 3, the basic SRAM cell 10 is combined with other SRAM cells to form a memory array 50 that is integrated onto a single semiconductor chip. In one example, a typical SRAM memory array is comprised of 1,048,576 SRAM cells, however, there are an endless number of possibilities for the array size. The motivation for creating integrated semiconductor chips with ever larger arrays of SRAM cells is that the area per cell decreases as more cells are integrated onto a chip. For example, four chips, each with arrays of 262,144 SRAM cells (an array of 512×512), occupy a greater surface area than a single chip with an array of 1,048,576 SRAM cells (an array of 1024×1024). The area occupied by a memory chip is important because many applications for the chip, such as personal computers, are continually attempting to provide more memory in less space.

In the illustrated example of FIG. 1, SRAM cell 10 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 10 typically has three states: standby, reading and writing. In the standby state, the circuit is idle waiting for a read or a write operation. In operation, the word line WL 16 is not asserted and so transistors 40, 45 disconnect the SRAM cell 10 from the bit lines BT 11 and BC 13. The first cross coupled inverter formed by transistors 30, 35 and the second cross coupled inverter formed by transistors 20, 25 continue to reinforce each other and the data remains unchanged.

In the read state, data within SRAM cell 10 is requested. Assume for purposes of explanation that the contents of the memory of SRAM cell 10 is a 1 stored at dt 32. The read cycles starts by pre-charging both the bit lines to a logical 1, then asserting the word line WL 16, thereby enabling both transistors 40, 45. The values stored in dt 32 and dc 22 are transferred to the bit lines BT 11 and BC 13 by leaving BC at its pre-charged value and discharging BT through transistor 40 and transistor 35 to a logical 0. On the BC side, transistor 20 and transistor 45 pull the bit line towards a $V_{CC}$, a logical 1. If, however, the contents of the memory of SRAM cell 10 was a logic 1, the opposite would happen and BT would be pulled towards a logic 1 and BC towards a logic 0.

In the write state, the contents of SRAM cell 10 is updated. The write cycle begins by applying the value to be written to the bit lines BT 11 and BC 13. If a logic 0 is desired to be written, a 0 is applied to the bit lines by setting BT 11 to 0 and BC 13 to 1. A logic 1 is written by inverting the values of the bit lines BT 11 and BC 106. The word line WL 16 is asserted and the value that is to be stored is latched into first data node dt 32 and second data node dc 22. The bit line input drivers are designed to be much stronger than the relatively weak transistors in the cell itself, so they can easily override the previous state of the cross-coupled inverters.

Each bit in an SRAM cell is stored on four transistors that form two cross-coupled inverters. The storage cell has two stable states, which are used to denote a 0 and a 1. Two additional transistors serve to control access to a storage cell during read and write operations. Accordingly, as described above, six transistors store one memory bit in SRAM cell 10.

Access to each cell is enabled by the word line (WL) 16 that controls the two transistors 40, 45. Transistors 40, 45 control whether the cell should be connected to the bit lines BT 11 and BC 13. Transistors 40, 45 are also used to transfer data for both the read and write operations. A bit line pair having two bit lines BT 11 and BC is not required, however, both the signal and the compliment of that signal are provided to improve noise margins.

Generally, as illustrated in FIG. 1, SRAM cell 10 comprises a plurality of n-channel, Field-Effect Transistors (FETs) and p-channel FET's. It should, however, be appreciated that combinations of different types of transistors can be utilized without departing from the intended scope and spirit of the present invention.

Figure 2:
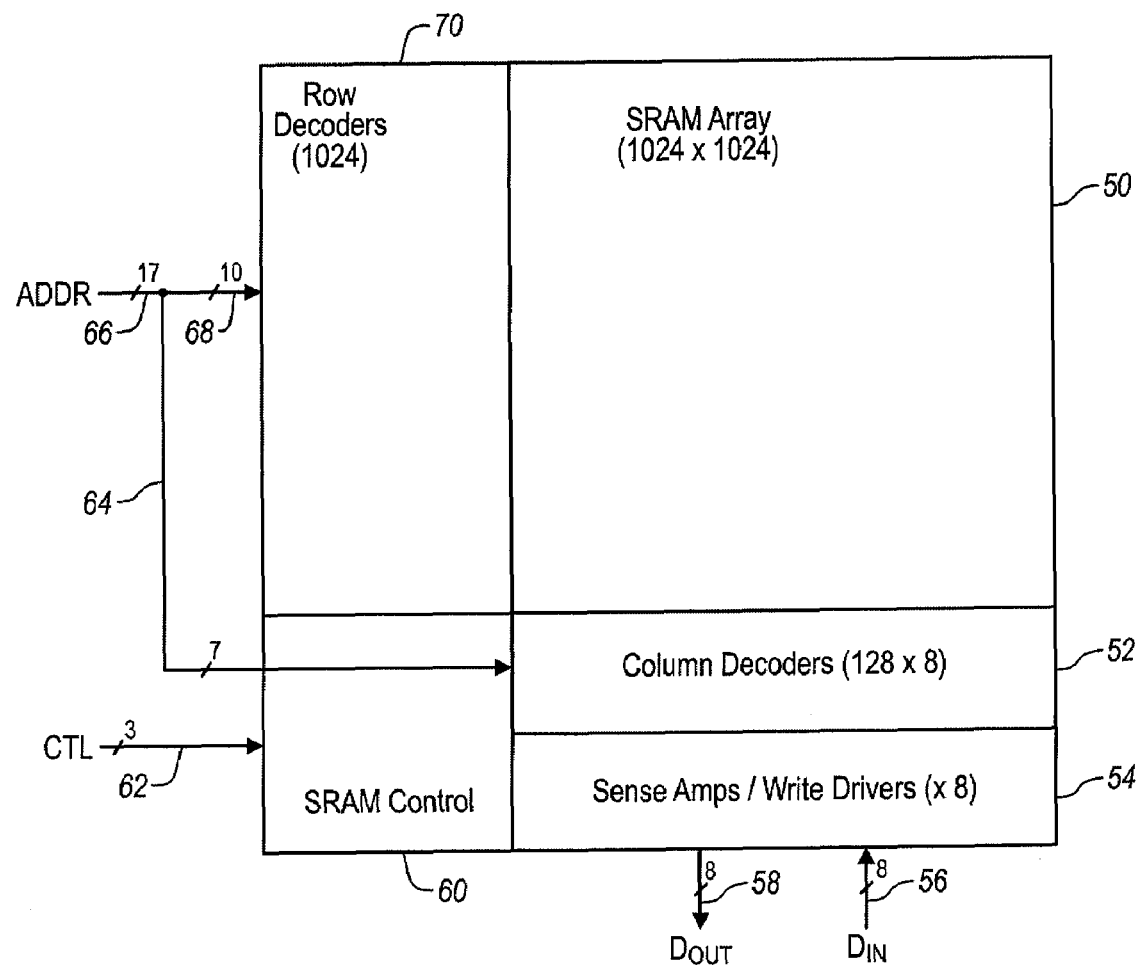
FIG. 2 is a block diagram illustrating an array of SRAM memory cells of FIG. 1 with apparatus for controlling the read and write operations to and from the array.

FIG. 2 is a block diagram illustrating an array of SRAM memory cells 50 illustrated and described with respect to a plurality of individual memory cells 10 of FIG. 1 with some of the accompanying devices for controlling the read and write operations to and from the SRAM array 50. In the illustrated example, SRAM array 50 is shown as 1 Mb array having a matrix of cells having 1024 rows and 1024 columns for a total of 1,056,784 SRAM cells, however, those skilled in the art will appreciate any number of rows N and columns M may be used depending upon the desired overall size of the array. For example, in a 4 Mb array, the SRAM array would be configured to have 2048 rows and 2048 columns, for a total of 4,194,304 SRAM cells arranged in a matrix of 2048 columns and 2048 rows.

Row decoders 70 and column decoders 52 are provided to read data from and write data to particular cells within the SRAM array 50. SRAM address inputs 66 are used to select the data stored in the SRAM array 50 for reading or writing. A first plurality of addresses 68 are inputs to the row decoders 70 and are configured for selecting the desired row in the SRAM array for writing data to or reading data from the particular row. A second plurality of addresses 64 are inputs to the column decoders 52 and are configured for selecting a desired column in the SRAM array 50 for writing data to and reading data from the particular column(s). Eight bidirectional inputs/outputs 56, 58 are provided to transfer data to and from the sense amps/write drives 54.

FIG. 3 is a block diagram illustrating a portion of an array of SRAM memory cells 80 taken from the full array 50 illustrated and described with respect to FIG. 2. SRAM memory array has a number of columns 81, 82, 83, 84 and a number of rows 86, 87, 88 corresponding to the desired size of the full memory array. Each memory cell in a particular column 81, 82, 83, 84 is coupled together by a bit line pair having a first bit line BT and second bit line BC. In the illustrated embodiment, the bit lines are shown as entering the top of each SRAM memory cell for illustrative purposes, however, the bit lines are positioned in relation to the SRAM cells as shown in FIG. 1. Typically, bit line BT and bit line BC run parallel to the SRAM memory cell, and the SRAM cell is located between the bit line pairs. A column of SRAM cells would therefore have a bit line pair BT and BC running parallel to the memory cells in the column, and each memory cell is coupled to the bit line pair such that the bit line pair is coupled to each memory cell in a column.

In the illustrated embodiment, SRAM memory cells 10A1-10AN, where N represents the number of rows in the SRAM array 50, would be connected to a common bit line pair BT 91 and BC 92. The transistors and their connections making up the SRAM memory cells 10A1-10AN would be positioned at a location between the bit lines BT 91 and BC 92. In a typical arrangement, the two internal data nodes of the SRAM memory cells are coupled through a pair of pass transistors to the bit lines that operate to couple and uncouple the SRAM cell from the bit lines in response to assertion of a word line that is also coupled to the pass transistor pair.

Each SRAM memory cell in a row 86, 87, 88 is coupled together by a common word line, a common supply voltage $V_{CCI}$ and a common ground node $V_{SSI}$. In such an arrangement, asserting a particular word line, for example, can activate each cell in a particular row. In the illustrated example, SRAM memory cells 10A2-10N2 in row 87, where N represents the number of columns in the SRAM array 50, would be connected to a common word line 95, a common supply voltage $V_{CCI}$ 93 and a common ground node $V_{SSI}$ 94.

In a full SRAM array operation, asserting a particular word line and a particular bit line pair can isolate a particular SRAM memory cell in the array 80 for purposes of writing data to it or reading data from it. In the illustrated example, manipulating bit lines 91, 92 and word line 95 can isolate SRAM memory cell 10A2. SRAM memory cell 10A2 can be read or written to without disturbing the contents of other SRAM cells in the array.

Figure 4:
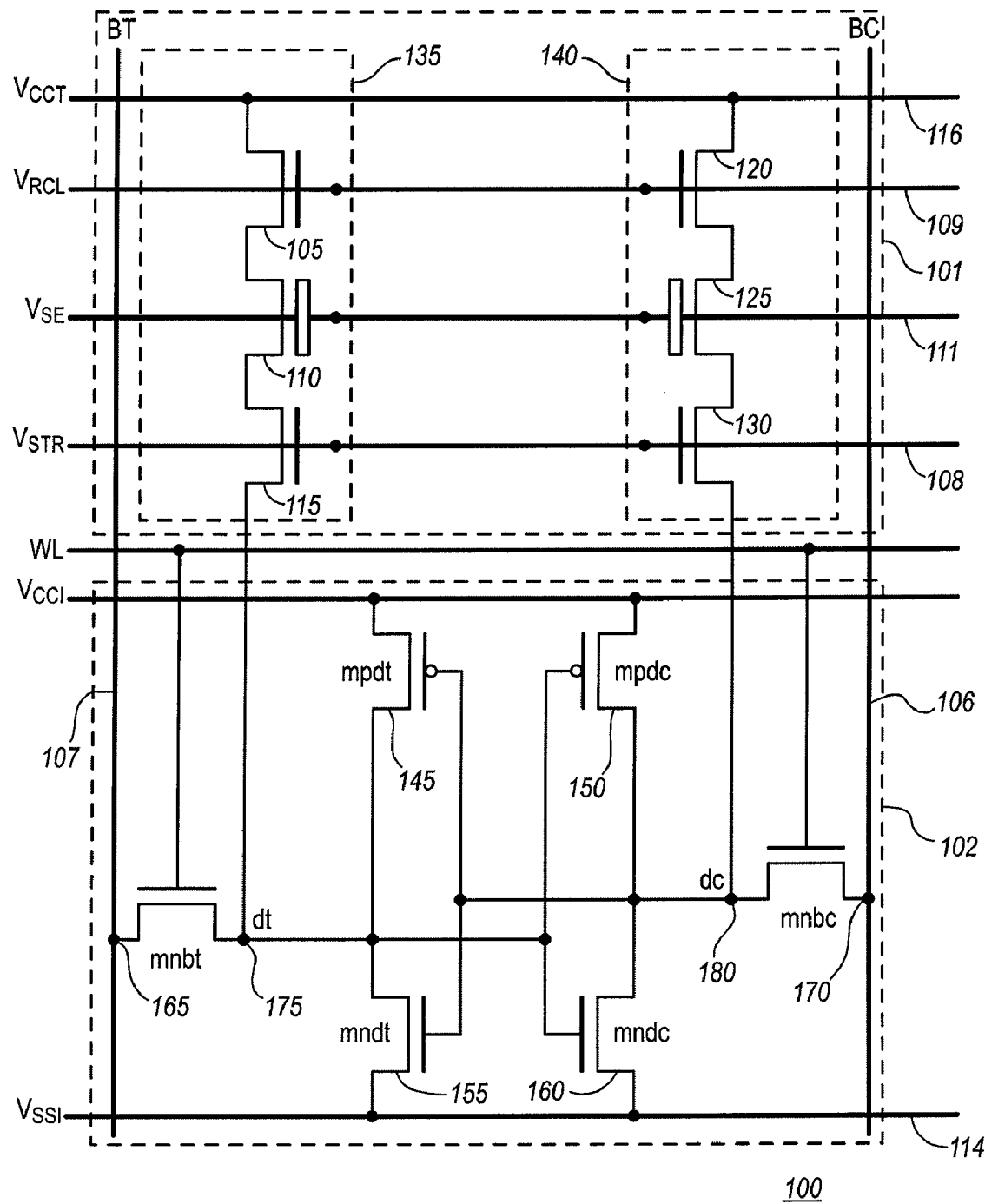
FIG. 4 is a schematic diagram illustrating an nvSRAM memory cell in accordance with one embodiment of the present invention.

FIG. 4 illustrates a typical nvSRAM cell 100 with a single SRAM 102 and a series-connected, non-volatile memory cell 101. While the nvSRAM cell 100 is illustrated as having a single nvSRAM memory cell 100 (in this case, a single non-volatile memory cell 101 and a single SRAM 102), it should be appreciated that an nvSRAM device typically includes a plurality of nvSRAM cells that are integrated with a controller onto a single semiconductor chip to form an array.

A basic nvSRAM cell 100 is comprised of a SRAM cell 102 that is capable of communicating a bit of data to and from an exterior environment and a non-volatile cell 101 for providing backup storage to the SRAM cell in the event power is removed from the nvSRAM cell 100. More particularly, the SRAM cell 102 is capable, as long as power is being provided, of receiving a bit of data from an exterior environment, retaining the bit of data, and transmitting the bit of data back to the exterior environment. If, however, power is removed from the SRAM cell 102, the SRAM cell will lose the bit of data. The non-volatile portion 101 prevents loss of the bit of data by providing the capability to receive the bit of data from the SRAM 102, retain the bit of data in the absence of power being provided to the SRAM cell 102, and return the bit of data to the SRAM cell 102 when power is present. For example, if there is a possibility of power to the SRAM cell 102 being lost, the bit of data can be transferred from the SRAM cell 102 to the nv cell 101 in a store operation. At a later time, the bit of data can be returned from the non-volatile cell 101 to the SRAM cell 102 in a recall operation. The SRAM cell 102 can then transmit the bit of data to the exterior environment, if desired.

Typically, the basic nvSRAM cell 100 is combined with other nvSRAM cells to form a memory array that is integrated onto a single semiconductor chip. One embodiment of a typical nvSRAM memory array is comprised of 1,048,576 nvSRAM cells making up a 1 Mb device. One skilled in the art will appreciate that any number nvSRAM cells may be used in an array depending upon the desired device size.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last. The configuration and operation of the SRAM cell 102 is identical to the configuration and operation illustrated and described with respect to the SRAM cell 10, and therefore will not be repeated.

The nonvolatile portion 101 includes a first silicon oxide nitride oxide semiconductor (SONOS) FET 110 and a second SONOS FET 125 for respectively storing the voltage state of the first SRAM FET 155 and the second SRAM FET 160 in the volatile portion 102. The voltage state of the first and second SRAM FETs 155, 160 is transferred into the first and second SONOS FETs 110, 125 by forcing, in a store operation, the threshold voltages for turning ON the first and second SONOS FETs 110, 125 to reflect the voltage states of the first and second SRAM FETs 155, 160. For example, if the first SRAM FET 155 is in an OFF state and the second SRAM FET 160 is in an ON state, the store operation would reflect this voltage state of the first and second SRAM FETs 155, 160 by forcing the threshold voltage for turning ON the first SONOS FET 110 to be less than the threshold voltage for turning ON the second SONOS FET 125. This forcing is accomplished by appropriately cycling a VSE signal applied to the gates of SONOS FETs 110, 125. It should be appreciated that the SONOS FETs 110, 125 can be replaced with other types of nonvolatile storage elements, such as silicon nitride oxide semiconductor (SNOS) transistors, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation and otherwise. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ are provided by a device control unit (not shown).

It should be appreciated that other nonvolatile configurations are possible to achieve the functions of the nonvolatile portion 101 of the cell 100 and the invention is in no way limited to the particular configuration illustrated in FIG. 4. The particular configuration utilized in any application will depend upon both technological and performance criteria.

Figure 5:
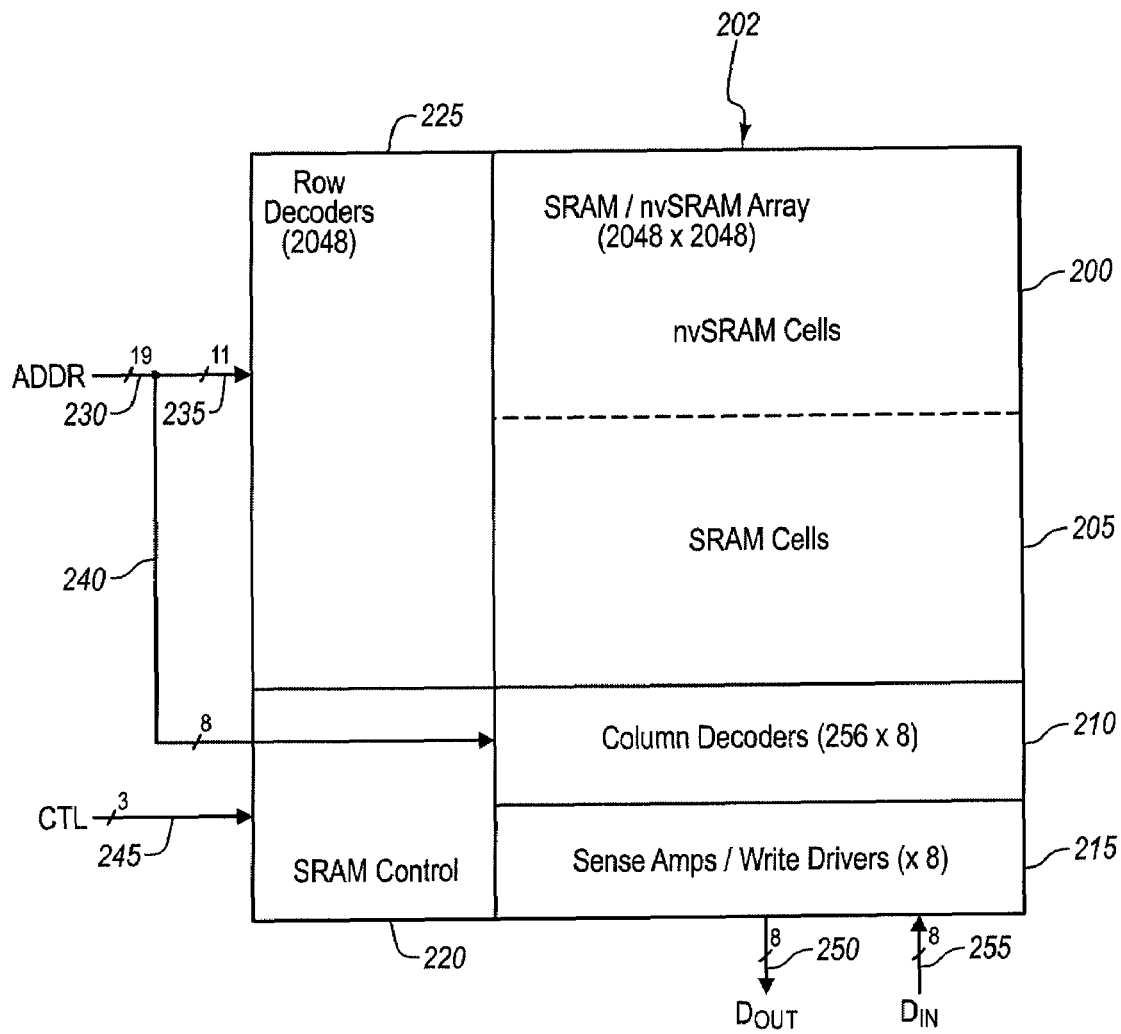
FIG. 5 is a block diagram illustrating a semiconductor array having a first array of SRAM memory cells of FIG. 1 and a second array of nvSRAM memory cells of FIG. 4 with apparatus for controlling the read and write operations to and from the combined semiconductor array.

FIG. 5 is a block diagram illustrating a semiconductor array 202 having a plurality of SRAM memory cells 205 that are each illustrated and described with respect to individual SRAM memory cell 10 of FIG. 1 and a plurality of nvSRAM memory cells 200 that are each illustrated and described with respect to the individual nvSRAM cell of FIG. 4. The diagram also shows some of the accompanying devices for controlling the read and write operations to and from the semiconductor array 202. In the illustrated example, SRAM array 202 is shown as 4 Mb array having a matrix of cells having 2048 rows and 2048 columns for a total of 4,194,304 SRAM/nvSRAM cells, however, those skilled in the art will appreciate any number of rows N and columns M may be used depending upon the desired overall size of the array. For example, in a 1 Mb array, the semiconductor array would be configured to have 1024 rows and 1024 columns, for a total of 1,048,576 SRAM/nvSRAM cells arranged in a matrix of 1024 columns and 1024 rows.

SRAM array 205 is illustrated as having 2048 columns and 1024 rows and nvSRAM array 200 is also illustrated as having 2048 columns and 1024 rows. Those skilled in the art will appreciate that any combination of rows and columns may be used for the SRAM array and the nvSRAM array depending upon the particular needs of the overall semiconductor array. Each column of the nvSRAM array 200 is aligned with a column of the SRAM array, and the aligned columns share a common bit line pair. This combined column configuration is illustrated and described in greater detail with respect to FIG. 6.

Row decoders 225 and column decoders 210 are provided to read data from and write data to particular cells within the semiconductor array 202. SRAM/nvSRAM address inputs 230 are used to select the data stored in the semiconductor array 202 for reading or writing. A first plurality of addresses 235 are inputs to the row decoders 225 and are configured for selecting the desired row in the semiconductor array for writing data to or reading data from the selected row. A second plurality of addresses 240 are inputs to the column decoders 210 and are configured for selecting a desired column in the semiconductor array 202 for writing data to and reading data from the selected column(s). Eight bidirectional inputs/outputs 250, 255 are provided to transfer data to and from the sense amps/write drives 215.

Figure 6:
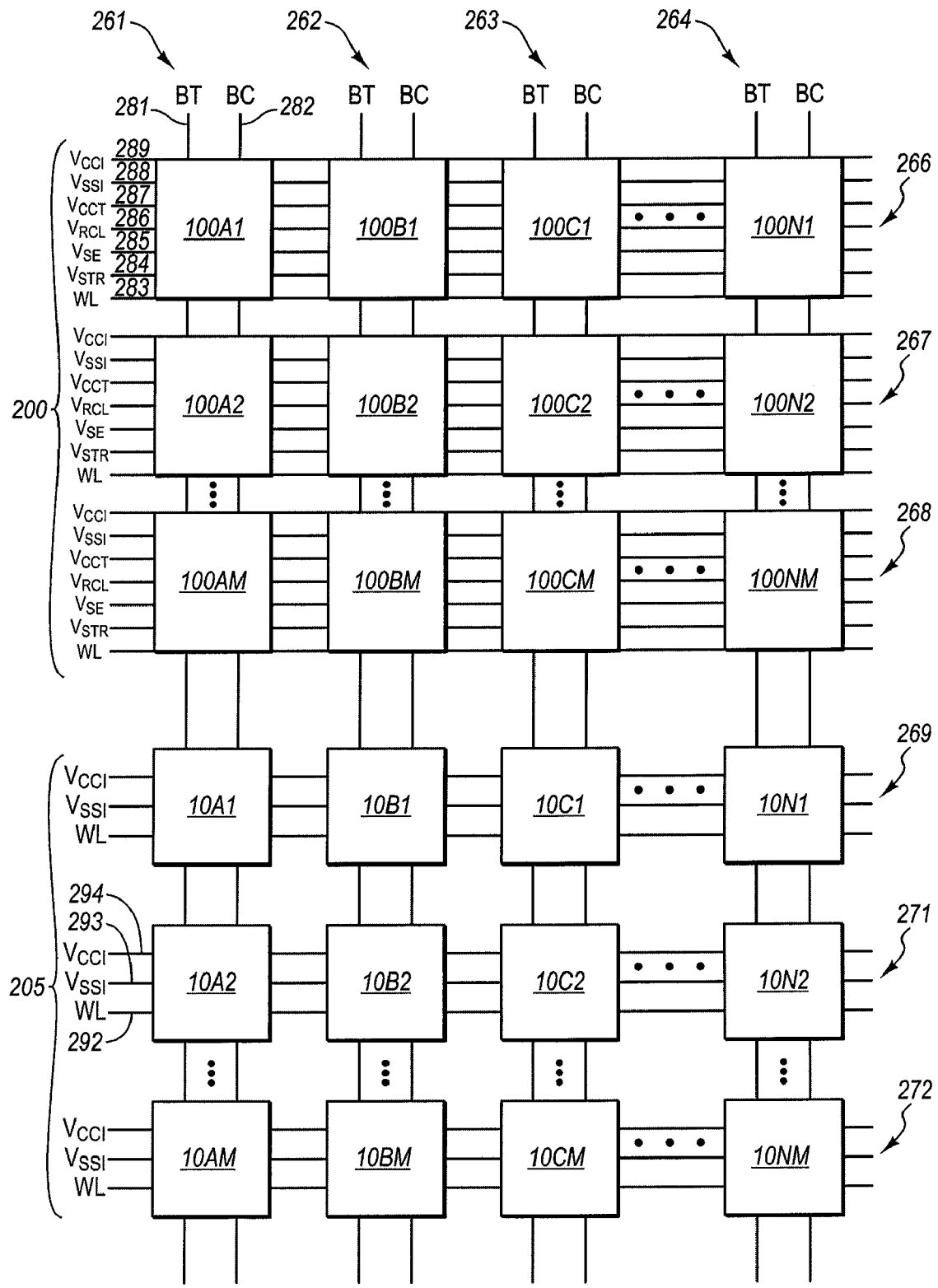
FIG. 6 is a block diagram illustrating a portion of a semiconductor array shown in FIG. 5 having a first array of SRAM memory cells and a second array of nvSRAM cells.

FIG. 6 is a block diagram illustrating a portion of an array of semiconductor array 202 having a plurality of nvSRAM cells 200 and a plurality of SRAM memory cells 205 taken from the full array illustrated and described with respect to FIG. 5. Semiconductor memory array 202 has a number of columns 261, 262, 263, 264 of SRAM and nvSRAM cells and a number of rows of nvSRAM cells 266, 267, 268 and a number of rows of SRAM cells 269, 271, 272 corresponding to the desired size of the full semiconductor memory array 202. Each memory cell in a particular column 261, 262, 263, 264 is coupled together by a bit line pair having a first bit line BT and second bit line BC. In the illustrated embodiment, the bit lines are shown as entering the top of each SRAM memory cell and nvSRAM memory cell for illustrative purposes, however, the bit lines are positioned in relation to the cells as shown in FIG. 1 and FIG. 4 respectively.

Typically, bit line BT and bit line BC run parallel to the aligned SRAM and nvSRAM memory cells, and the cells are located between the bit line pairs. A column of SRAM and nvSRAM cells would therefore have a bit line pair BT and BC running parallel to the memory cells in the column, and each memory cell is coupled to the bit line pair such that the bit line pair is coupled to each memory cell in a column.

In the illustrated embodiment, SRAM memory cells 10A1-10AM, where M represents the number of rows in the SRAM array 205, and nvSRAM memory cells 100A1-100AM, where M represents the number of rows in the nvSRAM array 200, would be connected to a common bit line pair BT 281 and BC 282. The transistors and their connections making up the SRAM memory cells 10A1-10AM and nvSRAM cells 100A1-100AM would be positioned at a location between the bit lines BT 281 and BC 282. In a typical arrangement, the two internal data nodes of the SRAM memory cells and the nvSRAM memory cells are coupled through a pair of pass transistors to the bit lines that operate to couple and uncouple the respective SRAM and nvSRAM cell from the bit lines in response to assertion of a word line that is also coupled to the pass transistor pair.

Each SRAM memory cell in a row 269, 271, 272 is coupled together by a common word line, a common supply voltage $V_{CCI}$ and a common ground node $V_{SSI}$. In such an arrangement, asserting a particular word line, for example, can activate each cell in a particular row. In the illustrated example, SRAM memory cells 10A2-10N2 in row 271, where N represents the number of columns in the semiconductor array 202, would be connected to a common word line 292, a common supply voltage $V_{CCI}$ 294 and a common ground node $V_{SSI}$ 293.

Similarly, each nvSRAM memory cell in a row 266, 267, 268 is coupled together by a common word line, a common supply voltage $V_{CCI}$ and a common ground node $V_{SSI}$. In such an arrangement, asserting a particular word line, for example, can activate each cell in a particular row. In the illustrated example, nvSRAM memory cells 100A1-100N1 in row 266, where N represents the number of columns in the semiconductor array 202, would be connected to a common word line 283, a common supply voltage $V_{CCI}$ 289 and a common ground node $V_{SSI}$ 288, a common trigate supply voltage $V_{CCT}$ 287, a common recall transistor gate node $V_{RCL}$ 286, a common store transistor gate node $V_{STR}$ 284 and a common SONOS transistor gate node $V_{SE}$ 285.

In a full semiconductor array operation, asserting a particular word line and a particular bit line pair can isolate a particular SRAM or nvSRAM memory cell in the array 202 for purposes of writing data to it or reading data from it. In the illustrated example, manipulating bit lines 281, 282 and word line 283 or word line 292 can isolate nvSRAM cell 100A1 or SRAM memory cell 10A2 respectively. Either nvSRAM memory cell 100A1 or SRAM memory cell 10A2 can be read or written to without disturbing the contents of other nvSRAM cells in the array 200 or SRAM cells in the array 205.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

I claim:

1. A semiconductor memory array comprising:
    a plurality of non-volatile SRAM cells arranged in a first plurality of rows and columns in said array; and
    a plurality of SRAM cells arranged in a second plurality of rows and columns in said array, each column of non-volatile SRAM cells coupled to a column of SRAM cells.

2. The semiconductor memory array of claim 1, further comprising:
    a means for inputting data to said semiconductor memory array, said means having a means for selecting a particular cell within said semiconductor memory array; and
    a means for outputting data from said semiconductor memory array, wherein each of said non-volatile SRAM cells are coupled to said means for inputting data to said semiconductor memory array and said means for outputting data from said semiconductor memory array and wherein each of said SRAM cells are coupled to said means for inputting data to said semiconductor memory array and said means for outputting data from said semiconductor memory array.

3. The semiconductor memory array of claim 1, wherein a non-volatile cell in each column of non-volatile SRAM cells is coupled to an SRAM cell in a column of SRAM cells.

4. The semiconductor memory array of claim 3, wherein said column to column coupling is on a one-to-one basis.

5. The semiconductor memory array of claim 1, further comprising a plurality of bit line pairs, wherein a single bit line pair is coupled to each non-volatile SRAM cell in a column of non-volatile SRAM cells and a single bit line pair is coupled to each SRAM cell in a column of SRAM cells and wherein each single bit line pair of a column of non-volatile SRAM cells is coupled to a single bit line pair of a corresponding column of SRAM cells.

6. The semiconductor memory array of claim 1, wherein said first plurality of rows and columns comprises a number of row of cells N and a number of columns of cells M, wherein N and M are each an integer of at least 2.

7. The semiconductor memory array of claim 6, wherein said second plurality of rows and columns comprises a number of row of cells O and a number of columns of cells P, wherein O and P are each an integer of at least 2.

8. The semiconductor memory array of claim 1, wherein each column of said nonvolatile SRAM memory cells is aligned with a column of SRAM cells such that said columns form a single combined column of non-volatile SRAM cells and SRAM cells.

9. The semiconductor memory array of claim 8, wherein each combined column of non-volatile SRAM cells and SRAM cells are coupled together by a single bit line pair.

10. The semiconductor memory array of claim 1, wherein each column of SRAM memory cells is aligned with a column of non-volatile SRAM cells such that said columns form a single column of non-volatile SRAM cells and SRAM cells.

11. The semiconductor memory array of claim 10, wherein each combined column of non-volatile SRAM cells and SRAM cells are coupled together by a single bit line pair.

12. The semiconductor memory array of claim 1, further comprising a plurality of row decoders coupled to each SRAM cell and non-volatile SRAM cell in said array.

13. The semiconductor memory array of claim 12, further comprising a plurality of column decoders coupled to each SRAM cell and non-volatile SRAM cell in said array.

14. The semiconductor memory of claim 13, further comprising a plurality of address inputs coupled to said row decoders and said column decoders for selecting any cell within said semiconductor memory array.

15. The semiconductor memory array of claim 1, wherein each of said plurality of non-volatile SRAM cells further comprises a volatile portion and a non-volatile portion, said volatile portion having an SRAM cell including a word line, a node supplying power to said SRAM cell and a node for grounding said SRAM cell, said SRAM cell coupled to a bit line pair having a first bit line and a second bit line, said non-volatile portion having a first and second non-volatile memory stack, each stack including a recall transistor, a store transistor and a SONOS transistor, wherein said store transistor of said first non-volatile memory stack is coupled to a first date node within said SRAM cell and wherein said store transistor of said second non-volatile memory stack is coupled to a second data node within said SRAM cell.

16. The semiconductor memory array of claim 15, wherein each of said plurality of SRAM cells further comprises six transistor SRAM cell having a word line, a node supplying power to said SRAM cell and a node for grounding said SRAM cell, each of said plurality of SRAM cells is coupled to a bit line pair having a first bit line and a second bit line.

17. A semiconductor memory device comprising:
    a plurality of volatile memory cells arranged in a first array of columns and rows;
    a plurality of non-volatile SRAM cells arranged in a second array of columns and rows; and
    a plurality of bit line pairs for coupling columns of volatile memory cells in said first array to columns of non-volatile SRAM cells in said second array, each column of volatile memory cells is coupled to a column of non-volatile SRAM cells by one of said plurality of bit line pairs.

18. The semiconductor memory cell of claim 17, wherein said volatile memory cells comprise a plurality of six-transistor SRAM cells, each SRAM cell comprising a word line; a node supplying power to said SRAM cell; and a node for grounding said SRAM cell, each of said plurality of SRAM cells being coupled to a bit line pair having a first bit line and a second bit line.

19. The semiconductor memory cell of claim 18, wherein said second memory cells comprise a plurality of non-volatile SRAM cells.

20. The semiconductor memory cell of claim 17, wherein each row of said plurality of volatile memory cells are coupled together by a single word line and wherein each row of said plurality of non-volatile SRAM cells are coupled together by a single word line.

21. A semiconductor device array comprising:
    a first memory cell array having a plurality of volatile memory cells arranged in a matrix of rows and columns;
    a second memory cell array having a plurality of non-volatile SRAM cells arranged in a matrix of rows and columns;
    a column selecting means coupled to said first memory array and said second memory array for selecting a combined column of memory cells, said combined column of memory cells having both a number of volatile memory cells from said plurality of volatile memory cells and a number of non-volatile SRAM cells; from said plurality of non-volatile SRAM cells; and
    a row selecting means coupled to said first memory array and said second memory array for selecting a row of memory cells from said first memory array and said second memory array, said column selecting means and said row selecting means configured for selecting a single memory cell within said first memory array and said second memory array.

22. The semiconductor device array of claim 21 wherein said plurality of first memory cells further comprises a plurality of SRAM cells.

23. The semiconductor device array of claim 22 wherein said plurality of second memory cells further comprises a plurality of non-volatile SRAM cells.

* * * * *